United States Patent [19]

Bertotti et al.

[11] 4,266,233
[45] May 5, 1981

[54] I-C WAFER INCORPORATING JUNCTION-TYPE FIELD-EFFECT TRANSISTOR

[75] Inventors: Franco Bertotti, Milan; Mario Foroni, Valeggio sul Mincio, both of Italy

[73] Assignee: SGS Ates Componenti Elettronici S.p.A., Agrate Brianza, Italy

[21] Appl. No.: 103,423

[22] Filed: Dec. 14, 1979

[30] Foreign Application Priority Data

Dec. 15, 1978 [IT] Italy ................. 30894 A/78

[51] Int. Cl.³ .................................... H01L 29/80
[52] U.S. Cl. ..................................... 357/22; 357/41; 357/48; 357/59
[58] Field of Search .................. 357/22, 48, 41, 59

[56] References Cited

U.S. PATENT DOCUMENTS

| | | | |
|---|---|---|---|
| 4,095,252 | 6/1978 | Ochi | 357/43 |
| 4,115,793 | 9/1978 | Nishizawa | 357/22 |
| 4,170,019 | 10/1979 | Hysell | 357/22 |
| 4,181,542 | 1/1980 | Yoshida | 148/187 |

*Primary Examiner*—Martin H. Edlow
*Attorney, Agent, or Firm*—Karl F. Ross

[57] ABSTRACT

A silicon wafer incorporating several semiconductor components, among them a junction-type field-effect transistor (J-FET) of low pinch-off voltage connectable as a resistor, comprises a substrate of P-type conductivity with an insular layer of N+ conductivity penetrated by one or more enclaves of substrate material. Thereafter, a stratum of N-doped silicon is epitaxially grown on the substrate, with formation of rising zones above each enclave and around the buried N+ layer which are heavily doped with P-type impurities to act as source connections or sinkers for an FET channel formed by the enclave or enclaves and as a barrier junction surrounding a section of the N-doped stratum which becomes the gate of the FET while the substrate serves as the drain.

5 Claims, 3 Drawing Figures

I-C WAFER INCORPORATING JUNCTION-TYPE FIELD-EFFECT TRANSISTOR

FIELD OF THE INVENTION

Our present invention relates to a silicon wafer incorporating several integrated semiconductor components including a junction-type field-effect transistor (J-FET).

BACKGROUND OF THE INVENTION

I-C structures of the general character referred to above are conventionally produced by epitaxial growth, starting from a monocrystalline silicon substrate, with suitable doping of selected portions of both the substrate and the epitaxial stratum. With a substrate of P-type conductivity, for example, a bipolar NPN transistor can be formed in this way by using a buried layer of N-type conductivity in the substrate as the collector, a P-type base layer embedded in the N-doped epitaxial stratum as a base, and an N-type layer embedded in the P-type base layer as an emitter; such a structure has been described and illustrated in commly owned U.S. patent application Ser. No. 99,897 filed 12-3-79 by one of us, Franco Bertotti, jointly with six others. The epitaxial stratum is generally subdivided into several sections by zones of the opposite conductivity type (P in this instance) forming barrier junctions designed to separate different semiconductor components from one another.

For economic reasons it is desirable to design the various components of a silicon wafer in such a way that, even though they may be of mutually different character, at least some of their constituent layers can be formed concurrently in the epitaxial stratum by the introduction of impurities through overlying masking layers. With this technique it is possible, in principle, to form a bipolar NPN transistor simultaneously with a J-FET of the N-channel type having a gate electrode connected to the substrate (which is usually grounded). When it is desired to convert such a J-FET into a resistor by conductively interconnecting its gate and source electrodes, the grounding of its gate is often an inconvenience especially when these electrodes are to be connected to those of other components. Moreover, it is difficult to design a field-effect transistor of this description with a pinch-off voltage below 10 V. One could also produce a P-channel FET in the wafer concurrently with a vertical NPN bipolar transistor by forming its channel simultaneously with the base layer of the latter; on account of the large amount of doping required for the base layer, however, this would lead to an undesirably high pinch-off voltage for the FET unless its P-channel were doped independently, e.g. via ion implantation, with resulting increase in cost.

OBJECTS OF THE INVENTION

The general object of our present invention, therefore, is to provide an improved I-C structure of the type referred to, incorporating a J-FET of low pinch-off voltage and with a channel having the same conductivity type (preferably P) as the substrate to allow the use of an ungrounded gate electrode.

A more particular object is to provide a structure of this character in which the J-FET can be formed concurrently with a vertical NPN bipolar transistor separated therefrom by a barrier junction

SUMMARY OF THE INVENTION

An I-C structure according to our present invention comprises, within a substrate of one conductivity type (e.g. P), a buried layer of opposite conductivity type (e.g. N) in contact with the overlying epitaxially grown stratum of that opposite conductivity type (N), this buried layer having one or more enclaves integral with the substrate and of the same conductivity type (P) extending into contact with the overlying stratum. A plurality of zones of the same conductivity type (P) as the substrate rise from the latter to a remote surface of the epitaxial stratum, each enclave being overlain by one such zone while another zone forms a barrier junction which separates a section of the stratum overlying the buried layer from other parts thereof. Each zone rising from an enclave of the buried layer is topped on the remote stratum surface by a first electrode, all these first electrodes (in case there are more than one) being conductively interconnected to act as a source of the J-FET constituted by the substrate, the buried layer and the overlying stratum section; a second electrode, acting as a gate, is disposed on the same remote surface in ohmic contact with the aforementioned stratum section while a third electrode, acting as a drain, contacts the substrate.

When the first and second electrodes of this J-FET are conductively interconnected and biased by a voltage of suitable magnitude and polarity, the channel formed by each enclave within the buried layer is pinched off to provide a path of elevated resistance between these interconnected electrodes and the third electrode (drain) in ohmic contact with the substrate. These enclaves can be made sufficiently narrow to let pinch-off occur with a biasing voltage on the order of 5 V.

BRIEF DESCRIPTION OF THE DRAWING

The above and other features of our present invention will now be described in detail with reference to the accompanying drawing in which.

SPECIFIC DESCRIPTION

Figure 1:
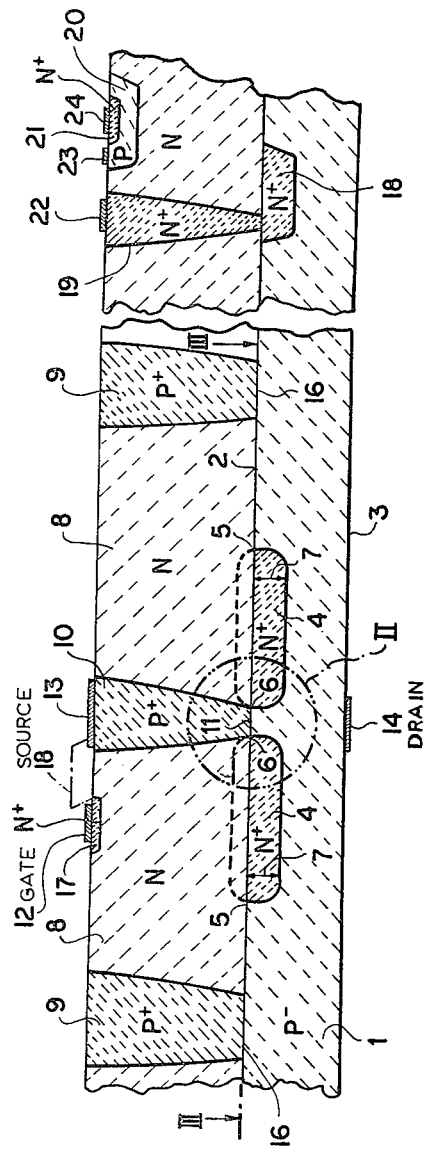
FIG. 1 is a cross-sectional view of a silicon wafer, illustrating diagrammatically a J-FET according to our invention.
Figure 3:
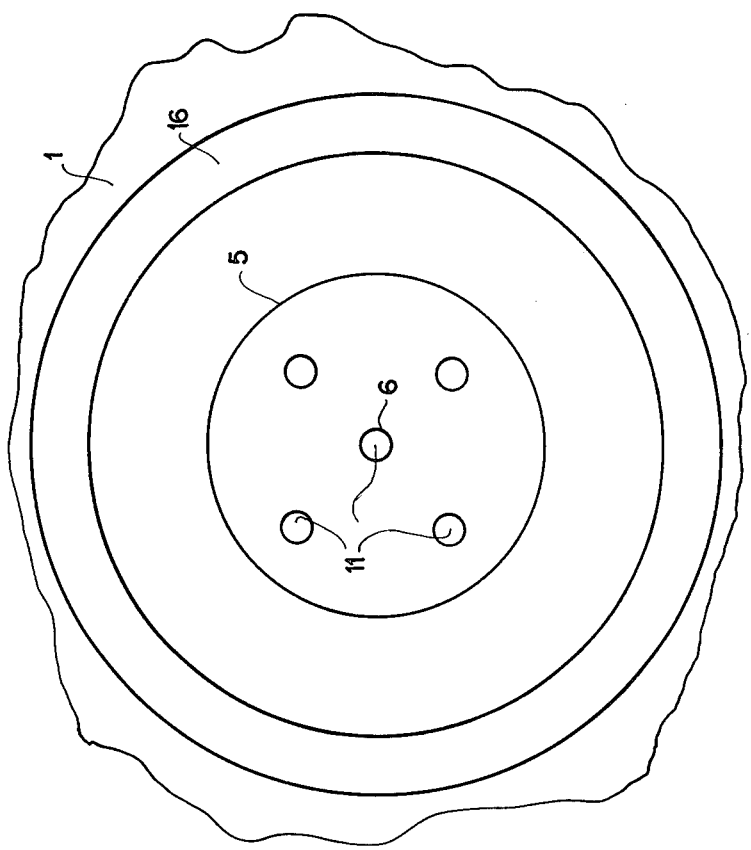
FIG. 3 is a top view of part of the wafer substrate as seen on the line III—III of FIG. 1.

In FIG. 1 we have shown a monocrystalline silicon substrate 1 of P⁻ conductivity in which a layer 4 of N+ conductivity and annular configuration, extending to a depth 7 substantially less than that of the substrate, has been formed by impurity diffusion in the conventional manner. Layer 4 has an outer perimeter 5 and an inner perimeter 6, the latter defining an enclave 11 of P⁻ conductivity constituting an integral extension of substrate 1. As illustrated in FIG. 3, several additional enclaves 11 of the same character may be formed around the central enclave shown in FIG. 1.

Substrate 1 is overlain by an epitaxially grown silicon stratum 8 of N conductivity traversed over its entire width by several zones 9 and 10 of P+ conductivity. Zone 9, rising from an annular area 16 of the substrate, forms a columnar barrier junction around buried layer 4 and all the mutually separated columns 10 (only one shown) rising from the several enclaves 11 seen in FIG. 3.

Rising zone 10 (and each of its nonillustrated counterparts) forms a conductive connection or sinker between an associated enclave 11 and a source electrode 13 lying on the upper surface of the stratum 8. A gate electrode 12 is in ohmic contact, through an embedded layer of N+ conductivity, with that section of stratum 8 which is encompassed by column 9 and which overlies the buried layer 4. A drain electrode 14 is directly applied to the underside of substrate 1 and may be considered grounded.

Figure 2:
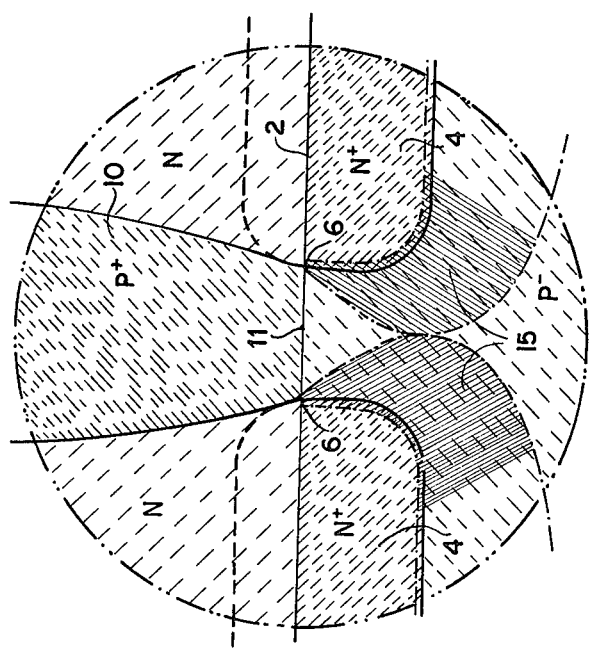
FIG. 2 is an enlarged view of an area encompassed by the circle II in FIG. 1.

When the gate and source electrodes 12, 13 are conductively interconnected, as schematically indicated in FIG. 1, the application thereto of a biasing voltage of about +5 V will set up a space charge in a region 15 (FIG. 2) of each enclave 11 depleted of mobile carriers to pinch off the channel formed thereby. A small part of the region of depletion 15 also extends into the buried layer 4 across the intervening P/N junction. The buried layer itself out-diffuses partly into the overlying stratum 8 as indicated in dotted lines in FIG. 1.

The rising zones 9 and 10 may differ from the N-type stratum 8 by being of predominantly polycrystalline character to accelerate their acceptance of doping impurities, as described in the aforementioned commonly owned application Ser. No. 99,897, filed 12/3/79. This can be accomplished, in the manner disclosed in that copending application, by the deposition of patches of polycrystalline silicon above the enclaves 11 and area 16 before the stratum 8 is epitaxially grown on the substrate. We have also indicated in FIG. 1 another buried layer 18 of N+ conductivity, formed in substrate 1 concurrently with layer 4, which constitutes the collector of an NPN bipolar transistor including a P-type base layer 20 with an embedded N+ layer 21 constituting its emitter. A zone 19 with N+ doping rises through the stratum 8 from the collector layer 18 to act as a sinker therefor, being topped by a collector electrode 22; base and emitter electrodes have been shown at 23 and 24. Emitter layer 24 can be formed simultaneously with the embedded layer 17 underlying the gate electrode 12. Transistor 18-21 can be surrounded by another barrier junction, similar to zone 9, which has not been illustrated.

We claim:

1. A silicon wafer comprising a monocrystalline silicon substrate of one conductivity type, an epitaxially grown silicon stratum of the opposite conductivity type overlying said substrate, a buried layer of said opposite conductivity type embedded in said substrate in contact with said stratum, said buried layer having at least one enclave integral with said substrate and of said one conductivity type extending into contact with said stratum, a plurality of zones of said one conductivity type rising from said substrate to a surface of said stratum remote from said substrate, one of said zones overlying said enclave, another of said zones forming a barrier junction which separates a section of said stratum overlying said buried layer from other parts of said stratum, a first electrode on said remote surface in ohmic contact with said one of said zones, a second electrode on said remote surface in ohmic contact with said section of said stratum, and a third electrode in ohmic contact with said substrate, said enclave forming part of a channel of a field-effect transistor with a source, a gate and a drain respectively constituted by said first, second and third electrodes.

2. A silicon wafer as defined in claim 1 wherein said channel comprises a plurality of enclaves spaced apart from one another in said buried layer, said one of said zones being duplicated above each of said enclaves.

3. A silicon wafer as defined in claim 1 or 2 wherein said one conductivity type is P and said opposite conductivity type is N.

4. A silicon wafer as defined in claim 3 wherein said substrate has P− conductivity, said stratum has N conductivity, said buried layer has N+ conductivity and said zones have P+ conductivity.

5. A silicon wafer as defined in claim 1 or 2, further comprising conductor means for short-circuiting said first and second electrodes to convert said field-effect transistor into a resistor.

* * * * *